US008441381B2

(12) United States Patent
Bajdechi et al.

(10) Patent No.: US 8,441,381 B2
(45) Date of Patent: May 14, 2013

(54) GATE LEAKAGE COMPENSATION IN A CURRENT MIRROR

(75) Inventors: Ovidiu Bajdechi, San Jose, CA (US); Tom W. Kwan, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 53 days.

(21) Appl. No.: 13/246,319

(22) Filed: Sep. 27, 2011

(65) Prior Publication Data

US 2013/0076549 A1 Mar. 28, 2013

(51) Int. Cl.
*H03M 1/00* (2006.01)
(52) U.S. Cl.
USPC .......................................... 341/135; 341/144
(58) Field of Classification Search .................. 341/144, 341/172, 118, 120, 135
See application file for complete search history.

(56) References Cited

U.S. PATENT DOCUMENTS

| 6,982,591 B2* | 1/2006 | Abadeer et al. ............... 327/543 |
| 6,995,612 B1* | 2/2006 | Chen ............................. 330/288 |
| 7,307,470 B2* | 12/2007 | Hasegawa ..................... 327/543 |
| 7,683,701 B2* | 3/2010 | Georgescu et al. ........... 327/539 |
| 7,750,695 B2* | 7/2010 | Caplan et al. ................. 327/148 |
| 8,093,952 B2* | 1/2012 | Behzad et al. ................ 330/288 |

\* cited by examiner

*Primary Examiner* — Peguy Jean Pierre
(74) *Attorney, Agent, or Firm* — Sterne, Kessler, Goldstein & Fox P.L.L.C.

(57) ABSTRACT

A method and apparatus is disclosed to compensate for gate leakage currents of thin oxide devices that have very thin oxide layers in a current mirror of a digital-to-analog converter (DAC). The DAC converts a digital input signal from a digital representation in a digital signaling domain to an analog representation in an analog signaling domain to provide an analog output signal. The DAC uses one or more transistors to convert the digital input signal from the digital representation to the analog representation. These transistors are typically implemented using thin oxide devices that have very thin oxide layers and corresponding gate leakage currents that are associated with these very thin oxide layers. The current-steering DAC provides these gate leakage currents independent of its corresponding reference source without any substantial affect upon its full scale output.

20 Claims, 4 Drawing Sheets

GATE LEAKAGE COMPENSATION IN A CURRENT MIRROR

BACKGROUND

1. Field of Invention

The present invention relates generally to compensation for gate leakage currents in a current mirror and specifically to compensation for gate leakage currents in a current mirror of a digital to analog converter (DAC).

2. Related Art

A digital-to-analog converter (DAC) is an electronic circuit that converts a digital input signal from a digital representation in the digital signaling domain to an analog representation in the analog signaling domain to provide an analog output signal. DACs can be designed for a wide range of applications, including general data acquisition applications and special applications, such as, but not limited to, video or graphic outputs, high definition video displays, ultra high-speed signal processing, and digital video recording.

A current-steering DAC represents a type of DAC that performs this conversion in a current domain. For example, the current-steering DAC includes a plurality of current sources, typically one for each bit of the digital input signal, that are arranged in parallel. The plurality of current sources are steered in accordance with the digital input signal to provide an analog representation of the digital input signal to as the analog output signal. Those current sources that are steered in a first direction contribute their corresponding currents to the analog output signal while those current sources that are steered in a second direction withdraw their corresponding currents from the analog output signal.

Ideally, transistors that form the current sources have sufficient insulation, commonly in the form of a gate oxide layer, between their respective gates and their respective drain to source channels such that no current flows from their respective gates to their respective drain to source channels during operation. However, the continuous down-scaling of these transistors has led to very thin oxide layers; thereby, allowing unwanted currents, referred to as gate leakage currents, to flow from their respective gates to their respective drain to source channels. Typically, these gate leakage currents increase exponentially as thicknesses of the gate oxide layers are reduced. Additionally, these leakage currents may vary in a large range over process and temperature. This variation commonly translates into a change of the full scale output of a conventional current-steering DAC which is an undesirable effect in communications systems where transmitted power is accurately specified, such as asymmetric digital subscriber line (ADSL) to provide an example.

Thus, there is a need for a method and an apparatus to compensate for the gate leakage currents that are associated with very thin oxide layers as described above. Further aspects and advantages of the present invention will become apparent from the detailed description that follows.

BRIEF DESCRIPTION OF THE DRAWINGS/FIGURES

The present invention is described with reference to the accompanying drawings. In the drawings, like reference numbers indicate identical or functionally similar elements. Additionally, the left most digit(s) of a reference number identifies the drawing in which the reference number first appears.

Figure 1:
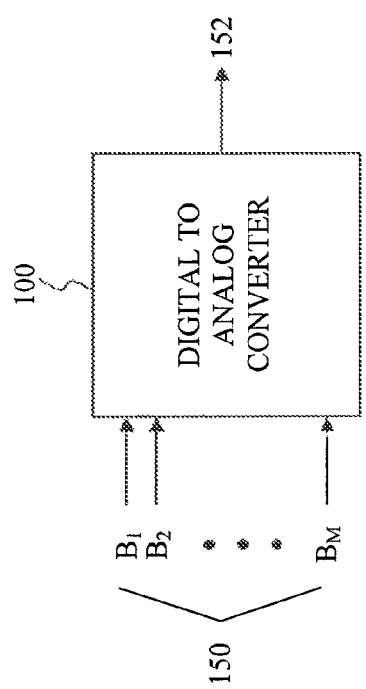
FIG. 1 illustrates a block diagram of a digital to analog converter (DAC) according to an exemplary embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following Detailed Description refers to accompanying drawings to illustrate exemplary embodiments consistent with the invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the present invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Exemplary Digital to Analog Converter (DAC)

FIG. 1 illustrates a block diagram of a DAC according to an exemplary embodiment of the present invention. A DAC 100 represents an interface between a digital signaling domain and an analog signaling domain. The DAC 100 converts a digital input signal 150 from a digital representation in the digital signaling domain to an analog representation in the analog signaling domain to provide an analog output signal 152. The analog output signal 152 may represent a differential signal including a first analog output signal 152(+) that is a complement of a second analog output signal 152(−). The digital input signal 150 includes M bits represented by bits $B_1$ through $B_M$, where $B_M$ represents a most significant bit (MSB) of the digital input signal 150 and $B_1$ represents a least significant bit (LSB) of the digital input signal 150.

The DAC 100 may be implemented using a voltage-mode circuit technology and/or a current-mode circuit technology. The DAC 100 separates a reference voltage into M voltage levels and weighs each of the M voltage levels in accordance with the M bits of the digital input signal 150 to provide the analog output signal 152 in the voltage-mode circuit technology. In the current mode circuit technology, the DAC 100 separates a reference current into M current levels and weighs each of the M current levels in accordance with the M bits of the digital input signal 150 to provide the analog output signal 152.

A current-steering DAC represents a type of DAC that uses the current mode circuit technology to convert a digital input signal to an analog output signal. The current-steering DAC includes a plurality of current sources, typically one for each bit of the digital input signal, that are arranged in parallel. These current sources are steered in accordance with the digital input signal to provide an analog representation of the digital input signal as the analog output signal. Those current sources that are steered in a first direction, also characterized as a positive direction, contribute their corresponding currents to the analog output signal. Those current sources that are steered in a second direction, also characterized as a negative direction, withdraw their corresponding currents from the analog output signal.

Conventional Current-Steering DAC

Figure 2:
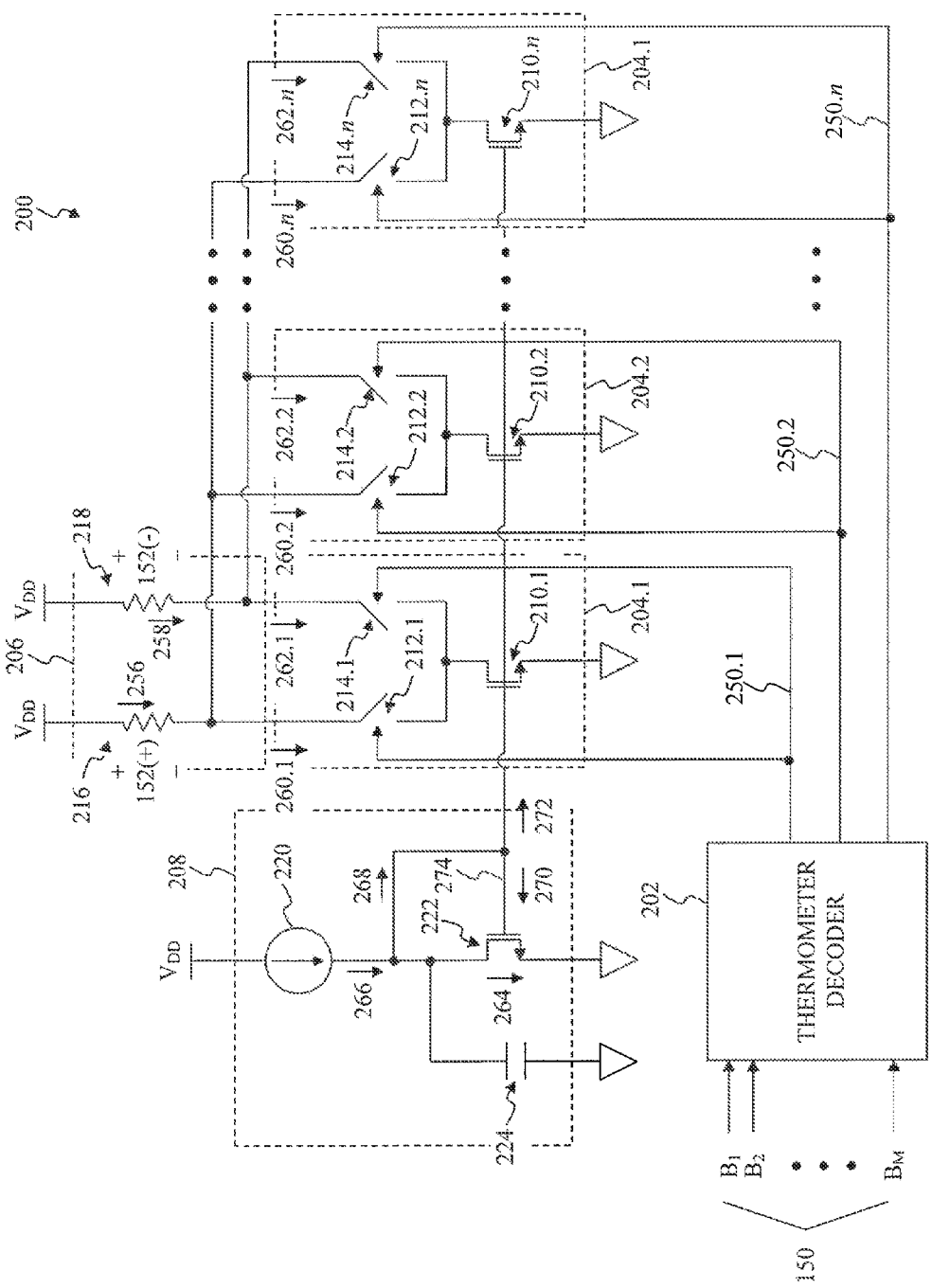
FIG. 2 illustrates a conventional current-steering DAC.

FIG. 2 illustrates a conventional current-steering DAC. A conventional current-steering DAC 200 converts the digital input signal 150 from the digital representation in the digital signaling domain to the analog representation in the analog signaling domain to provide the analog output signal 152. The conventional current-steering DAC 200 includes a thermometer decoder 202, DAC current cells 204.1 through 204.$n$, an optional output stage 206, and a reference cell module 208.

The thermometer decoder 202 decodes the M bits of the digital input signal 150 in accordance with a thermometer code to provide control bits 250.1 through 250.$n$. Typically, the thermometer decoder 202 includes $2^M$ control bits 250.1 through 250.$n$ to decode the M bits of the digital input signal 150 in accordance with the thermometer code. The thermometer code represents a coding scheme that provides a unique combination of the control bits 250.1 through 250.$n$ from among $2^M$ possible combinations of the control bits 250.1 through 250.$n$ for each possible combination of the M bits of the digital input signal 150. For example, an 8-bit thermometer code may be used represent the binary numbers 000 through 111. In this example, the unique combination for the binary number 000 would be 00000000, the unique combination for the binary number 001 would be 00000001, the unique combination for the binary number 010 would be 00000011, the unique combination for the binary number 101 would be 00011111, and the unique combination for the binary number 111 would be 11111111.

The DAC current cells 204.1 through 204.$n$ are steered in either the positive direction or the negative direction in accordance with the control bits 250.1 through 250.$n$. The DAC current cells 204.1 through 204.$n$ sink a corresponding DAC cell current 260.1 through 260.$n$ from an analog output current 256 in the positive direction and/or a corresponding DAC cell current 262.1 through 262.$n$ from an analog output current 258 in the negative direction. The DAC current cells 204.1 through 204.$n$ are substantially similar to each other; therefore, only the DAC current cell 204.1 is to be described in further detail. The DAC current cell 204.1 includes a steerable current source 210.1, a positive switch 212.1, and a negative switch 214.1. The positive switch 212.1 provides the DAC cell current 260.1 from the analog output current 252 to the steerable current source 210.1 when closed in response to the control bit 250.1. Similarly, the negatives switch 214.1 provides the DAC cell current 262.1 from the analog output current 258 to the steerable current source 210.1 when closed in response to the control bit 250.1. Typically, the switch 212.1 and the switch 214.1 are closed or switched in a complementary manner by the control bit 250.1 such that only one of these switches is closed at any given instance in time.

The optional output stage 206 converts the analog output current 256 and the analog output current 258 from a current representation in the current domain to a voltage representation in the voltage domain to provide the analog output signal 152(+) and the analog output signal 152(−), respectively. The optional output stage 206 includes an output resistor 216 and an output resistor 218 to convert the analog output current 256 and the analog output current 258, respectively, from the representation in the current domain to the representation in the voltage domain.

The reference cell module 208 generates a reference current 264 that is mirrored by the DAC current cells 204.1 through 204.$n$. The reference cell module 208 includes a reference current source 220, a reference transistor 222, and a decoupling capacitor 224. The reference current source 220 provides a reference current 266. The reference current 266 is converted into a reference biasing voltage 274 for the reference transistor 222 to cause a reference current 264 to flow through the reference transistor 222. Ideally, the reference current 266 is approximately equal to the reference current 264 that is flowing through reference transistor 222; however, as to discussed below, gate leakage currents prevalent in the conventional current-steering DAC 200 cause the reference current 264 to be less than the reference current 266.

The reference cell module 208 biases the steerable current sources 210.1 through 210.$n$ with the reference biasing voltage 274. The reference transistor 222 and the steerable current sources 210.1 through 210.$n$ are configured and arranged to form a current mirror. The reference transistor 222 represents a reference portion of the current mirror and the DAC current cells 204.1 through 204.$n$ represent a mirroring portion of the current mirror. The current mirror causes the DAC cell currents 260.1 through 260.n and/or the DAC cell currents 262.1 through 262.n to be proportional to the reference current 264 when biased with the reference biasing voltage 274. The decoupling capacitor 224 filters noise introduced by the reference current source 220 and/or the reference transistor 222 at frequencies greater than or equal to:

$$\frac{g_m}{2\pi C}, \quad (1)$$

where $g_m$ represents a transconductance of the reference transistor 222 and C represents a capacitance of the decoupling capacitor 224.

Ideally, the steerable current sources 210.1 through 210.n and the reference transistor 222 have sufficient insulation, commonly in the form of a gate oxide layer, between their respective gates and their respective drain to source channels such that no current flows from their respective gates to their respective drain to source channels during operation. However, the continuous down-scaling of these devices has led to very thin oxide layers; thereby allowing unwanted currents, referred to gate leakage currents, to flow from their respective gates to their respective drain to source channels. Typically, these gate leakage currents increase exponentially as thicknesses of the gate oxide layers are reduced.

The steerable current sources 210.1 through 210.n and the reference transistor 222 are implemented using thin oxide devices. These thin oxide devices typically have very thin oxide layers and corresponding gate leakage currents that are associated with these very thin oxide layers. These gate leakage currents sink power from the reference current source 220 as a gate leakage current 268. The reference transistor 222 and the steerable current sources 210.1 through 210.n sink a reference gate leakage current 270 and a cell gate leakage current 272, respectively, from the gate leakage current 268. The reference gate leakage current 270 flows through a gate of the reference transistor 222 to its drain to source channel. The cell gate leakage current 272 flows through gates of the steerable current sources 210.1 through 210.n to their respective drain to source channels. Typically, the steerable current sources 210.1 through 210.n and the reference transistor 222 and are matched transistors, such that the reference cell gate leakage current 272 may be represented as:

$$I_{272}=n*I_{270}, \quad (2)$$

where $I_{272}$ represents the cell gate leakage current 272, n represents a number of current sources in the steerable current sources 210.1 through 210.n when the steerable current sources 210.1 through 210.n are significantly matched, and $I_{270}$ represents the reference gate leakage current 270. As these examples illustrate, approximately +1)*$I_{270}$ of the reference current 266 comprises the leakage currents for the steerable current sources 210.1 through 210.n and the reference transistor 222 which may represent a significant portion of the reference current 266.

As a result, these leakage currents may cause a reduction in the reference current 264 that is mirrored by the steerable current sources 210.1 through 210.n, thereby reducing a full scale output of the conventional current-steering DAC 200. For example, the reference current 264 may be represented as:

$$I_{264}=I_{266}-(I_{270}+I_{272}) \quad (3)$$

where $I_{264}$ represents the reference current 264, $I_{266}$ represents the reference current 266, $I_{270}$ represents the reference gate leakage current 270, and $I_{272}$ represents the cell gate leakage current 272. In this example, the full scale output of the conventional current-steering DAC 200 is proportionally reduced by the reference gate leakage current 270 and the cell gate leakage current 272 in the presence of the leakage currents for the reference transistor 222 and the steerable current sources 210.1 through 210.n.

Additionally, these leakage currents may vary in a large range over process and temperature. This variation commonly translates into a change of the full scale output of the conventional current-steering DAC 200 which is an undesirable effect in communications systems where transmitted power is accurately specified, such as asymmetric digital subscriber line (ADSL) to provide an example.

Exemplary Current-Steering DAC

Figure 3:
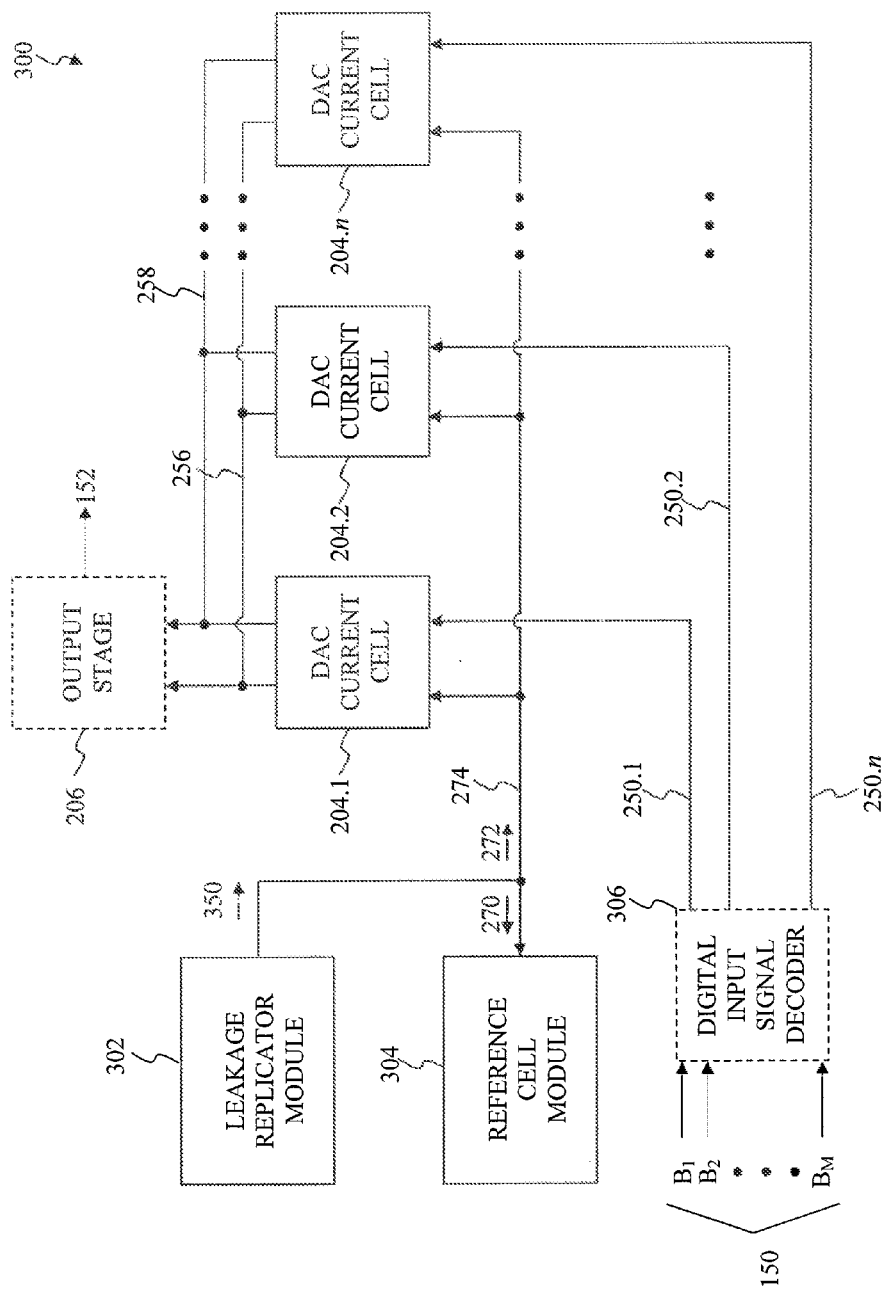
FIG. 3 illustrates a block diagram of a current-steering DAC according to an exemplary embodiment of the present invention.

FIG. 3 illustrates a block diagram of a current-steering DAC according to an exemplary embodiment of the present invention. A current-steering DAC 300 converts the digital input signal 150 from the digital representation in the digital signaling domain to the analog representation in the analog signaling domain to provide the analog output signal 152. The current-steering DAC 300 uses one or more transistors to mirror a reference current and steers this mirrored current to convert the digital input signal 150 from the digital representation to the analog representation. These transistors are commonly implemented using thin oxide devices that have very thin oxide layers and corresponding gate leakage currents that are associated with these very thin oxide layers. The current-steering DAC 300 provides these gate leakage currents independent of the reference current without substantially affecting its full scale output. The current-steering DAC 300 includes the DAC current cells 204.1 through 204.n, the optional output stage 206, a leakage replicator module 302, and a reference cell module 304, and an optional digital input signal decoder 306. The current-steering DAC 300 may represent an exemplary embodiment of the DAC 100. The current-steering DAC 300 shares many substantially similar features as the conventional current-steering DAC 200; therefore, only differences between the conventional current-steering DAC 200 and the current-steering DAC 300 are to be discussed below.

The leakage replicator module 302 provides a replica leakage current 350 that is proportional to a leakage current flowing through the DAC current cells 204.1 through 204.n and/or the reference cell module 304. The DAC current cells 204.1 through 204.n and/or the reference cell module 304 are commonly implemented using thin oxide devices that have very thin oxide layers and corresponding gate leakage currents that are associated with these very thin oxide layers.

The leakage replicator module 302 replicates a gate leakage current that is flowing through one or more of these devices to provide a replica unit leakage current. The leakage replicator module 302 weighs the replica unit leakage current to provide the replica leakage current 350. For example, the leakage replicator module 302 weighs the replica unit leakage current by a proportionality constant ($\Psi$) such that the replica leakage current 350 is approximately equal to the leakage current of the DAC current cells 204.1 through 204.n and/or the reference cell module 304. As another example, the proportionality constant ($\Psi$) may represent a number of devices from among the DAC current cells 204.1 through 204.n and/or the reference cell module 304 that sink leakage currents from their respective gates and their respective drain to source channels. Typically, the replica leakage current 350 may be represented as:

$$I_{350}=I_{270}+I_{272}, \quad (4)$$

where $I_{350}$ represents the replica leakage current 350, $I_{270}$ represents the reference gate leakage current 270 and $I_{272}$ represents the cell gate leakage current 272.

The reference cell module 304 provides the reference biasing voltage 274 to the DAC current cells 204.1 through 204.n. The reference cell module 304 includes one or more devices that are biased accordingly with the reference biasing voltage 274 to sink a reference current from a reference current supply. These one or more devices and/or the DAC current cells 204.1 through 204.n are commonly implemented using thin oxide devices that have very thin oxide layers and corresponding gate leakage currents that are associated with these very thin oxide layers. These gate leakage currents are independently supplied by the leakage replicator module 302 allowing the reference current flowing through the one or more devices of the reference cell module 304 to be approximately equal to a current provided by the reference current supply. This independence allows the leakage replicator module 302 to provide the replica leakage current 350 to the DAC current cells 204.1 through 204.n and/or the reference cell module 304 without any substantial affect upon the full scale output of the current-steering DAC 300.

The reference cell module 304 also provides the reference biasing voltage 274 to the DAC current cells 204.1 through 204.n to allow the DAC current cells 204.1 through 204.n to provide DAC cell currents that are proportional to the reference current flowing through the reference cell module 304.

The optional digital input signal decoder 306 decodes the M bits of the digital input signal 150 in accordance with a code to provide control bits 250.1 through 250.n. The code may include a binary code, a thermometer code, a gray code, or any other suitable code that may be used to encode one or more digital bits, bytes, words, and/or symbols into the M bits of the digital input signal 150 that will be apparent to those skilled in the relevant art(s) without departing from the spirit and scope of the present invention. In some situations, the M bits of the digital input signal 150 may be directly provided to the DAC current cells 204.1 through 204.n. In these situations, effective dimensions of active devices within the DAC current cells 204.1 through 204.n may differ between the active devices to effectively weight the M bits of the digital input signal 150. For example, the effective dimensions of the active devices within the DAC current cells 204.1 through 204.n may be binarily related. In other situations, the M bits of the digital input signal 150 may represent M unencoded bits.

Figure 4:
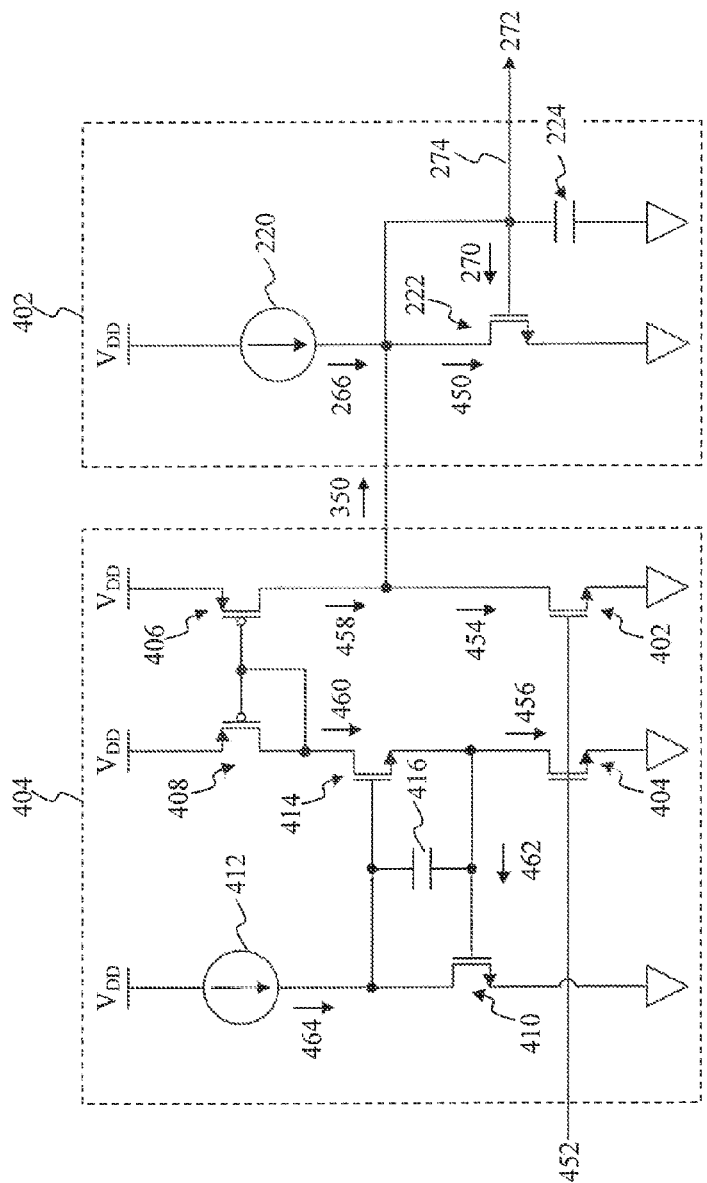
FIG. 4 illustrates a leakage replicator module and a reference cell module that are implemented as part of the current-steering DAC according to an exemplary embodiment of the present invention.

Exemplary Leakage Replicator Module and Reference Cell Module that are Implemented as Part of the Current-Steering DAC FIG. 4 illustrates a leakage replicator module and a reference cell module that are implemented as part of the current-steering DAC according to an exemplary embodiment of the present invention. A current-steering DAC, such as the current-steering DAC 300 to provide an example, includes DAC current cells, such as the DAC current cells 204.1 through 204.n, to convert a digital input signal from a digital representation in the digital signaling domain to an analog representation in the analog signaling domain to provide an analog output signal.

The reference cell module 402 produces the reference biasing voltage 274 for the reference transistor 222 that causes a reference current 450 to flow through the reference transistor 222. The reference cell module 402 additionally provides the reference biasing voltage 274 to the DAC current cells that causes currents, which are proportional to the reference current 450, to flow through the DAC current cells. The reference cell module 402 may represent an exemplary embodiment of the reference cell module 304. The reference cell module 402 shares many substantially similar features as the reference cell module 208; therefore, only differences between the reference cell module 208 and the reference cell module 402 are to be discussed below.

The reference cell module 402 and the DAC current cells are typically implemented using thin oxide devices that have very thin oxide layers and corresponding gate leakage currents that are associated with these very thin oxide layers. In contrast to the conventional current-steering DAC 200, these gate leakage currents are independently provided by a leakage replicator module 404. This independence allows most, if not all, of the reference current 266 to be mirrored by the DAC current cells as the reference current 450.

The leakage replicator module 404 includes a first n-type current source 402, a second n-type current source 404, a first p-type current mirror transistor 406, a second p-type current mirror transistor 408, a replica transistor 410, a current source 412, a gate biasing transistor 414, and a stability capacitor 416. The leakage replicator module 404 may represent an exemplary embodiment of the leakage replicator module 302.

The first n-type current source 402 and the second n-type current source 404 are biased by a current source bias 452 such that a first current 454 and a second current 456 flow through the first n-type current source 402 and the second n-type current source 404, respectively. In an exemplary embodiment, the first n-type current source 402 and/or the second n-type current source 404 are implemented using thick oxide devices that have thick oxide layers and usually a negligible gate leakage current is associated with these thick oxide layers. Typically, an effective width of the first n-type current source 402 is larger than an effective width of the second n-type current source 404 by a factor of (M+1) such that:

$$I_{454}=(M+1)*I_{456}, \qquad (5)$$

where $I_{454}$ represents the first current 454, (M+1) represents a ratio of a size of the first n-type current source 402 to a size of the second n-type current source 404, and $I_{456}$ represents the second current 456. In an exemplary embodiment, the first n-type current source 402 and the first p-type current mirror transistor 406 may be characterized as having high impedances at their respective drains to allow the decoupling capacitor 224 to effectively filter the reference, current 266.

The first p-type current mirror transistor 406 and the second p-type current mirror transistor 408 are configured and arranged to form a current mirror. In an exemplary embodiment, the first p-type current mirror transistor 406 and the second p-type current mirror transistor 408 are implemented using thick oxide devices that have thick oxide layers and usually a negligible gate leakage current is associated with these thick oxide layers. The current mirror causes the first replica current 458 flowing through the first p-type current mirror transistor 406 is proportional to the second replica current 460. The first replica current 458 may be represented as:

$$I_{458}=(M+1)*I_{460}, \qquad (6)$$

where $I_{458}$ represents the second replica current 458, (M+1) represents a ratio of a size of the first p-type current mirror transistor 406 to a size of the second p-type current mirror transistor 408, and $I_{460}$ represents the second replica current 460.

The replica current source 412 provides a replica current 464. In an exemplary embodiment, the replica current source 412 is a scaled version of the reference current source 220. In another exemplary embodiment, the reference current source 220 and the replica current source 412 are derived from a common origin such that differentiations, such as process differences or temperature differences to provide some examples, between these two current sources is minimized. This common origin may represent a voltage source and/or a current source that is used by the reference current source 220 and the replica current source 412 to provide the reference current 266 and the replica current 464, respectively. In a further exemplary embodiment, the common origin may also be used to provide the supply voltage $V_{DD}$.

The gate biasing transistor 414 provides a drain bias for the replica transistor 410 such that the replica current 464 flows through the replica transistor 410. In an exemplary embodiment, the replica transistor 410 is substantially matched to at least one of the steerable current sources 210.1 through 210.n, and/or the reference transistor 222. The replica transistor 410 typically has a very thin oxide layer and a gate leakage current 462 that is associated with this very thin oxide layer. The gate leakage current 462 may be represented as:

$$I_{462} = I_{460} - I_{456}, \quad (8)$$

where $I_{462}$ represents the gate leakage current 462, $I_{460}$ represents the second replica current 460, and $I_{456}$ represents the second current 456. The stability capacitor 416 ensures the drain biasing of the replica transistor 412 by the gate biasing transistor 410 remains stable.

Noting that the replica leakage current 350 may be represented as:

$$I_{350} = I_{458} - I_{454}, \quad (9)$$

where $I_{460}$ represents the replica leakage current 350, $I_{456}$ represents the second current 456 and $I_{462}$ represents the first current 454, the replica leaking current 350 may be represented as:

$$I_{350} = (M+1) * I_{462}, \quad (10)$$

where $I_{350}$ represents the replica leakage current 350, (M+1) represents a ratio of a size of the first p-type current mirror transistor 406 to a size of the second p-type current mirror transistor 408, and $I_{462}$ represents the gate leakage current 462.

CONCLUSION

It is to be appreciated that the Detailed Description section, and not the Abstract section, is intended to be used to interpret the claims. The Abstract section may set forth one or more, but not all exemplary embodiments, of the present invention, and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the invention. Thus the present invention should not be limited by any of the above-described exemplary embodiments; but should be defined only in accordance with the following claims and their equivalents.

What is claimed is:

1. A digital-to-analog converter (DAC) for converting a digital input to an analog output, comprising:
    a plurality of DAC current cells configured to be steered in accordance with the digital input to convert the digital input to the analog output;
    a leakage replicator module configured to replicate a gate leakage current flowing through one of the plurality of DAC current cells using a first current source and to weigh the gate leakage current by a proportionality constant ($\Psi$) to provide a replica leakage current; and
    a reference cell module configured to provide a reference current using a second current source, different from the first current source, to be mirrored by the plurality of DAC current cells,
    wherein leakage currents of the reference cell module and the plurality of DAC current cells are provided from the replica leakage current.

2. The DAC of claim 1, wherein the leakage currents of the reference cell module and the plurality of DAC current cells are provided by the second current source independent of the first current source.

3. The DAC of claim 1, wherein at least one DAC current cell from among the plurality of DAC current cells comprises:
    a steerable current source configured to mirror the reference current to provide a DAC cell current;
    a first switch configured to contribute the DAC cell current to the analog output when steered in a positive direction; and
    a second switch configured to contribute the DAC cell current to the analog output when steered in a negative direction.

4. The DAC of claim 3, wherein the analog output signal includes a first analog output signal and a second analog output signal, wherein the first switch is further configured to contribute the DAC cell current to the first analog output when steered in the positive direction, and wherein the second switch is further configured to contribute the DAC cell current to the second analog output when steered in the negative direction.

5. The DAC of claim 1, wherein the proportionality constant ($\Psi$) causes the replica leakage current to be approximately equal to the leakage currents of the reference cell module and the plurality of DAC current cells.

6. The DAC of claim 1, wherein the plurality of DAC current cells and the reference cell module include a plurality of devices, and
    wherein the leakage replicator module is further configured to weigh the replica leakage current by a number of devices from among the plurality of devices that sink a leakage current.

7. The DAC of claim 1, wherein the leakage replicator module comprises:
    a replica transistor configured to replicate the gate leakage current; and
    a current mirror configured to weigh a replica of the gate leakage current to provide the replica leakage current.

8. The DAC of claim 7, wherein the replica transistor is configured to substantially match a device within the plurality of DAC current cells sinking the gate leakage current.

9. The DAC of claim 7, wherein the current mirror comprises:
    a first n-type current source configured to provide a first current;
    a second n-type current source configured to provide a second current proportional to the first current;

a first p-type current mirror transistor, coupled to first n-type current source, configured to provide a first replica current; and a second p-type current mirror transistor, coupled to the second n-type current source, configured to provide a second replica current proportional to the first replica current, wherein the replica leakage current represents a difference between the second current and the second replica current.

10. The DAC of claim 9, wherein the current mirror further comprises:

a gate biasing transistor, coupled between the first n-type current source and first p-type current mirror transistor, configured to provide a bias to the replica transistor, the bias causing the replica transistor to sink a second gate leakage current from the first replica current.

11. The DAC of claim 9, wherein the second p-type current mirror transistor is approximately (M+1) times larger than the first p-type current mirror transistor, wherein M represents a number of devices in the plurality of DAC current cells that are sinking the gate leakage current.

12. The DAC of claim 1, wherein the leakage replicator module comprises:

a replica transistor configured to substantially match a device within the plurality of DAC current cells sinking the gate leakage current; and a gate biasing transistor configured to apply a bias from the first current source to the replica transistor to cause the replica transistor to sink a second gate leakage current, the second gate leakage current being the replica of the gate leakage current.

13. The DAC of claim 1, wherein the first current source and the second current source are derived from a common origin.

14. A digital-to-analog converter (DAC) for converting a digital input to an analog output, comprising:

means for steering a plurality of DAC current cells in accordance with the digital input to convert the digital input to the analog output;

means for replicating a gate leakage current flowing through one of the plurality of DAC current cells using a first current source and to weigh the gate leakage current by a proportionality constant ($\Psi$) to provide a replica leakage current; and means for providing a reference current using a second current source, different from the first current source, to be mirrored by the plurality of DAC current cells, wherein leakage currents of the reference cell module and the plurality of DAC current cells are provided from the replica leakage current.

15. The DAC of claim 14, wherein the proportionality constant ($\Psi$) causes the replica leakage current to be approximately equal to a combined leakage current flowing through the plurality of DAC current cells and the means for providing the reference current.

16. The DAC of claim 14, wherein the plurality of DAC current cells and the means for providing the reference current include a plurality of devices, and wherein the means for replicating is further configured to weigh the replica leakage current by a number of devices from among the plurality of devices that sink a leakage current.

17. An apparatus, comprising:

a current mirror having a reference portion and a mirroring portion, the reference portion and the mirroring portion being implemented using devices that sink leakage currents;

a first current source configured to provide a reference current to the reference portion and a reference biasing voltage to the reference portion and the mirroring portion;

a leakage replicator module configured to replicate a gate leakage current that is flowing through the mirroring portion using a second current source, different from the first current source, and to weigh the gate leakage current by a proportionality constant ($\Psi$) to provide a replica leakage current, wherein leakage currents of the current mirror are provided from the replica leakage current.

18. The apparatus of claim 17, wherein the mirroring portion is configured to provide a current that is proportional to the reference current when biased with the reference biasing voltage.

19. The apparatus of claim 17, wherein the leakage replicator module comprises:

a replica transistor configured to replicate the gate leakage current; and a second current mirror configured to weigh a replica of the gate leakage current to provide the replica leakage current.

20. The apparatus of claim 17, wherein the leakage replicator module comprises:

a replica transistor configured to substantially match one of the devices within the current mirror; and a gate biasing transistor configured to apply a bias from the second current source to the replica transistor to cause the replica transistor to sink a second gate leakage current, the second gate leakage current being the replica of the gate leakage current.

* * * * *